(12) United States Patent
Meng et al.

(10) Patent No.: US 8,999,028 B2
(45) Date of Patent: Apr. 7, 2015

(54) APPARATUS AND METHOD FOR COLLECTING POWDER GENERATED DURING FILM DEPOSITION PROCESS

(71) Applicant: Macronix International Co., Ltd., Hsinchu (TW)

(72) Inventors: Xianping Meng, Hsinchu (TW); Bingfu Chen, Hsinchu (TW); Licheng Hu, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 111 days.

(21) Appl. No.: 13/924,396

(22) Filed: Jun. 21, 2013

(65) Prior Publication Data

US 2014/0261702 A1    Sep. 18, 2014

Related U.S. Application Data

(60) Provisional application No. 61/786,617, filed on Mar. 15, 2013.

(51) Int. Cl.
*B01D 50/00* (2006.01)
*C23C 16/34* (2006.01)
*C23C 16/44* (2006.01)

(52) U.S. Cl.
CPC ........... *C23C 16/345* (2013.01); *C23C 16/4412* (2013.01)

(58) Field of Classification Search
USPC .............. 137/808; 55/342.1, 345, 434.2, 448, 55/459.1, 465
See application file for complete search history.

(56) References Cited

U.S. PATENT DOCUMENTS

| | | | | |
|---|---|---|---|---|
| 1,538,335 A | * | 5/1925 | Koehler | 261/92 |
| 3,582,051 A | * | 6/1971 | Klein et al. | 261/79.2 |
| 3,648,441 A | * | 3/1972 | Soria et al. | 96/332 |
| 5,186,836 A | * | 2/1993 | Gauthier et al. | 210/512.1 |
| 5,788,747 A | * | 8/1998 | Horiuchi et al. | 95/288 |
| 5,904,757 A | * | 5/1999 | Hayashi et al. | 96/416 |
| 6,107,198 A | | 8/2000 | Lin et al. | |
| 6,263,590 B1 | * | 7/2001 | Whigham et al. | 34/426 |
| 6,547,844 B2 | * | 4/2003 | Rikyuu et al. | 55/315.1 |
| 6,908,499 B2 | * | 6/2005 | Lin et al. | 95/290 |
| 7,491,292 B2 | * | 2/2009 | Han et al. | 156/345.29 |
| 7,510,172 B2 | * | 3/2009 | Kojima | 261/79.2 |
| 7,837,770 B2 | * | 11/2010 | Lee et al. | 95/290 |
| 8,808,453 B2 | * | 8/2014 | Carlsen | 118/715 |
| 2006/0130448 A1 | * | 6/2006 | Han et al. | 55/434.2 |
| 2006/0169411 A1 | * | 8/2006 | Han et al. | 156/345.29 |
| 2009/0107091 A1 | * | 4/2009 | Cho et al. | 55/434.2 |

* cited by examiner

*Primary Examiner* — John Rivell
*Assistant Examiner* — Minh Le
(74) *Attorney, Agent, or Firm* — Alston & Bird LLP

(57) ABSTRACT

An apparatus for controlling a flow of gas comprises a spiral path guiding member. The spiral path guiding member comprises at least two groups of guiding plates. Each guiding plate of each group is disposed in an axial direction to form a longitudinal axis. Each group is spaced apart in the longitudinal direction. A surface of each guiding plate is substantially parallel to the longitudinal axis. At least one guiding plate of each group has a guiding plate opening. Guiding plate openings of the guiding plates may facilitate gas to flow in a spiral flow path.

20 Claims, 3 Drawing Sheets

APPARATUS AND METHOD FOR COLLECTING POWDER GENERATED DURING FILM DEPOSITION PROCESS

CROSS-REFERENCE TO RELATED APPLICATION

This application claims priority of provisional Application No. 61/786,617, filed on Mar. 15, 2013, the contents of which are incorporated herein by reference in their entireties.

TECHNOLOGICAL FIELD

The present invention generally relates to an apparatus and method for fabricating semiconductor device. More specifically, the invention relates to an apparatus and method for wastes trapping during semiconductor manufacture.

BACKGROUND

In the semiconductor production industry, various processing steps are used to fabricate integrated circuits on a wafer. Chemical vapor deposition (CVD) process, plasma enhanced chemical vapor deposition (PECVD) method, and atmospheric pressure chemical vapor deposition (APCVD) method are well-known methods for depositing and forming layers on the underlying substrate. Silicon such as silicon nitride, silicon oxide, silicon dioxide, silicon carbide, and/or other silicon compounds are widely used in semiconductor technologies for electronic devices, such as microwave frequency integrated circuits, light-emitting diodes, laser diodes, solar cells, high-power and high-frequency electronics, and opto-electronic devices.

In a typical CVD process, the substrate is exposed to one or more volatile precursors, which react and/or decompose on the substrate surface to produce the desired deposit. Frequently, volatile by-products are also produced. For example, during silicon nitride LPCVD process, using as precursors, dichlorosilane ($SiH_2Cl$) may be reacted with ammonia ($NH_3$) to produce silicon nitride. The chemical reaction can be described as follows:

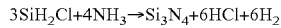

$$3SiH_2Cl + 4NH_3 \rightarrow Si_3N_4 + 6HCl + 6H_2$$

By-products, for example, ammonium chloride ($NH_4Cl$) and hydrogen chloride (HCl), may be produced in the CVD process. Ammonium chloride ($NH_4Cl$) may leave the process furnace in vapor form but readily condense to fine powder that will accumulate in any cold surface of the vacuum system such as valve, vacuum pump, and vacuum pump exhaust line. As the build-up of by-products increase within the cold trap, system presses FIG. 4 increasingly hard to control. Frequent cleaning and/or replacing of lines, valves, and vacuum pumps may increase cost of maintenance.

BRIEF SUMMARY OF EXEMPLARY EMBODIMENTS OF THE INVENTION

The present invention provides a method and apparatus that controls a flow of gas to reduce by-products thereby substantially reducing production downtime needed for cleaning and/or replacing of lines, valves, and vacuum pumps that may increase cost of maintenance.

According to one exemplary embodiment of the present invention, an apparatus for controlling a flow of gas comprises a spiral path guiding member. The spiral path guiding member comprises at least two groups of guiding plates. Each guiding plate of each group is disposed in an axial direction to form a longitudinal axis. Each group is spaced apart in the longitudinal direction. A surface of each guiding plate is substantially parallel to the longitudinal axis. At least one guiding plate of each group has a guiding plate opening. Guiding plate openings of the guiding plates may facilitate gas to flow in a spiral flow path.

According to one exemplary embodiment of the present invention, a method of controlling a gas flow comprises diverting a flow of gas in a spiral flow path defined by a spiral path guiding member. The spiral path guiding member comprises at least two groups of guiding plates. Each guiding plate of each group is disposed in an axial direction to form a longitudinal axis. Each group is spaced apart in the longitudinal direction. A surface of each guiding plate is substantially parallel to the longitudinal axis. At least one guiding plate of each group has a guiding plate opening. Guiding plate openings of the guiding plates may facilitate gas to flow in a spiral flow path.

According to one exemplary embodiment of the present invention, an apparatus for controlling a flow of gas comprises a post having a longitudinal axis, a cooling member and a spiral path guiding member. The cooling member comprises two or more parallel cooling plates connected to the post and spaced apart in a longitudinal direction. A surface of each cooling plate is substantially perpendicular to the longitudinal axis of the post. Each cooling plate comprises at least one cooling plate opening. Two adjacent cooling plates are configured to define a space. The spiral path guiding member comprises at least two groups of guiding plates. Each guiding plate of each group is connected to the post in an axial direction. Each group is placed in the space defined by two adjacent cooling plates. A surface of each guiding plate is substantially parallel to the longitudinal axis of the post. At least one guiding plate of each group has a guiding plate opening. At least one guiding plate is shorter than other guiding plates in the group to form a space above the shorter guiding plate. The guiding plate openings and the space above the shorter guiding plate facilitate gas to flow in a spiral flow path.

BRIEF DESCRIPTION OF THE SEVERAL VIEWS OF THE DRAWINGS

Figure 1:
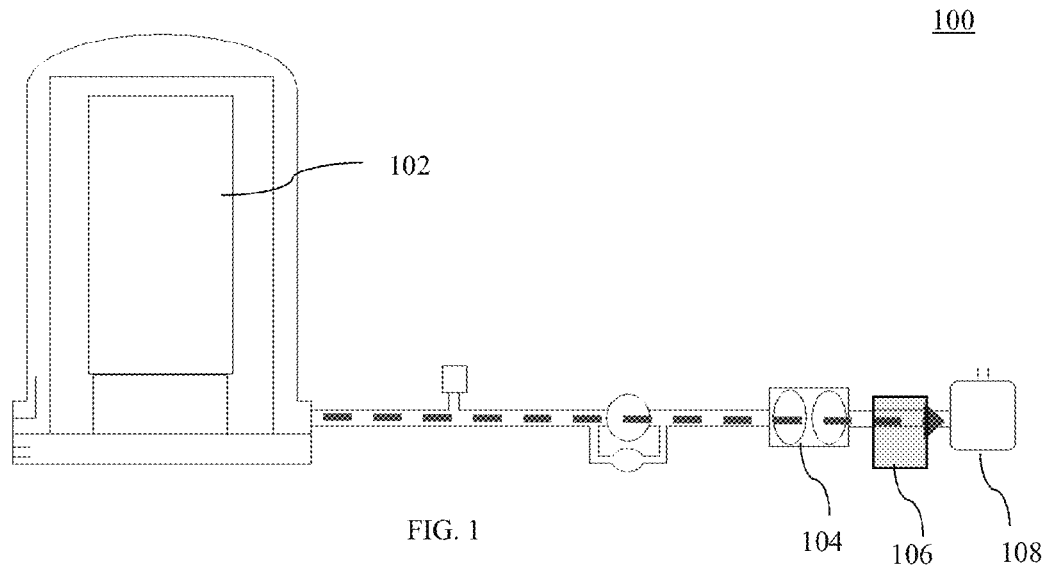
Figure 2A:
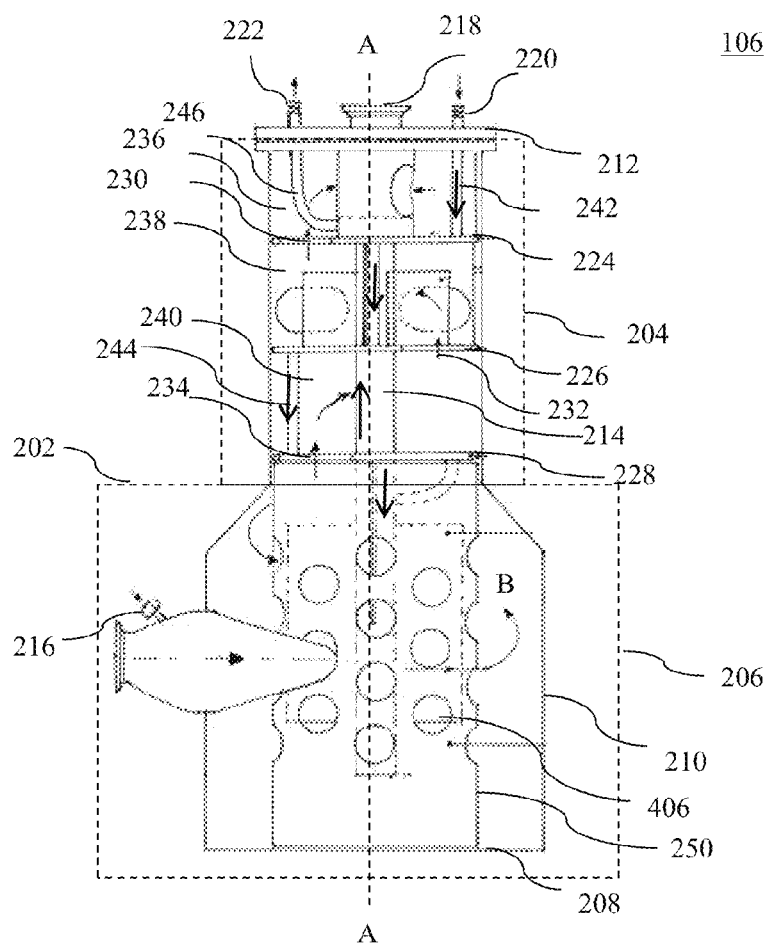
Figure 2B:
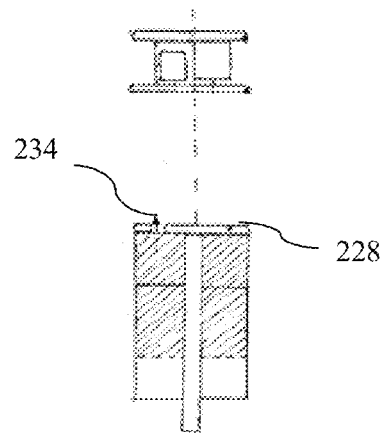
Figure 2C:
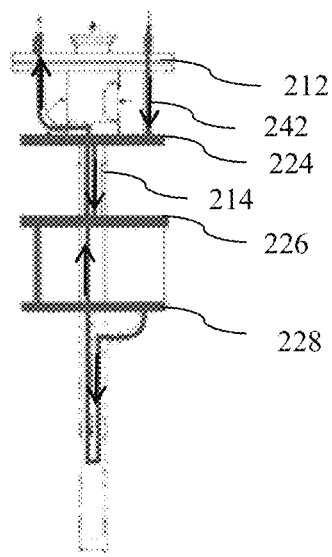
Figure 3:
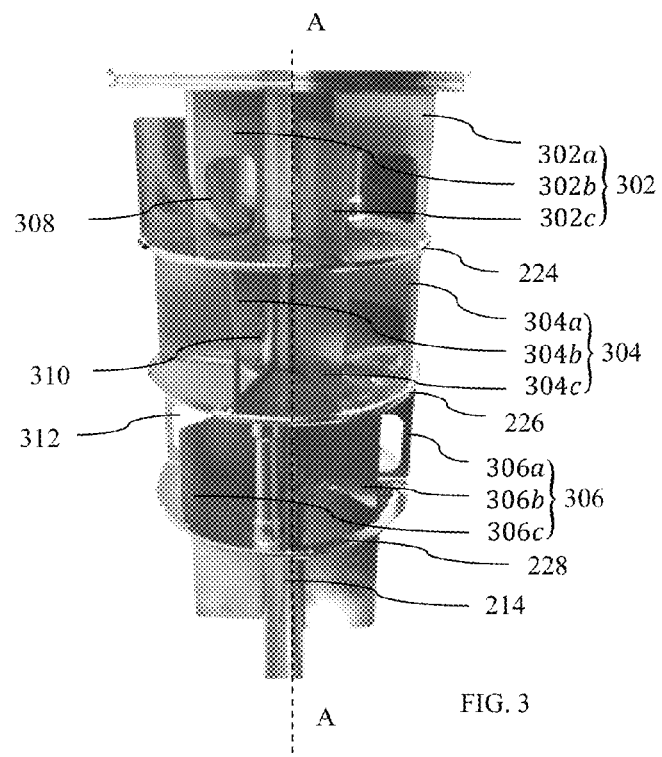
Figure 4:
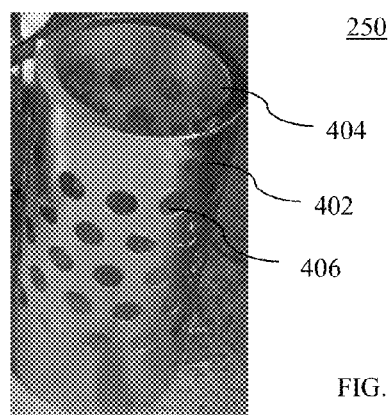
Figure 5:
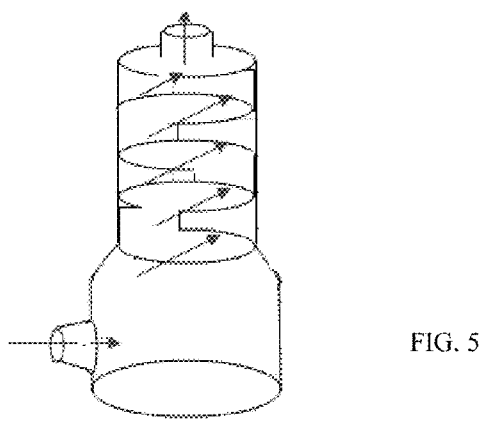

Having thus described the invention in general terms, reference will now be made to the accompanying drawings, which are not necessarily drawn to scale, and wherein:

FIG. 1 illustrates a schematic view of a deposition system;

FIG. 2A illustrates a schematic view of a cold trap in accordance with an embodiment of the invention;

FIG. 2B illustrates a sectional view of a cooling member in accordance with an embodiment of the invention;

FIG. 2C illustrates a cooling path in accordance with an embodiment of the invention;

FIG. 3 illustrates a spiral path guiding member and a cooling member in accordance with an embodiment of the invention;

FIG. 4 illustrates a gas flow guiding member in accordance with an embodiment of the invention; and FIG. 5 illustrates a gas flow path in accordance with an embodiment of the invention.

DETAILED DESCRIPTION

Some embodiments of the present invention will now be described more fully hereinafter with reference to the accompanying drawings, in which some, but not all embodiments of the invention are shown. Indeed, various embodiments of the invention may be embodied in many different forms and should not be construed as limited to the embodiments set forth herein; rather, these embodiments are provided so that this disclosure will satisfy applicable legal requirements.

Although specific terms are employed herein, they are used in a generic and descriptive sense only and not for purposes of limitation. All terms, including technical and scientific terms, as used herein, have the same meaning as commonly understood by one of ordinary skill in the art to which this invention belongs unless a term has been otherwise defined. It will be further understood that terms, such as those defined in commonly used dictionaries, should be interpreted as having a meaning as commonly understood by a person having ordinary skill in the art to which this invention belongs. It will be further understood that terms, such as those defined in commonly used dictionaries, should be interpreted as having a meaning that is consistent with their meaning in the context of the relevant art and the present disclosure. Such commonly used terms will not be interpreted in an idealized or overly formal sense unless the disclosure herein expressly so defines otherwise. In this regard, although example embodiments may be described herein in the context of a CVD process, it should be understood that the spiral course formed by spiral path guiding members for capturing fine powder may not be limited to be used in the CVD process. Also, for example, references may be made herein to directions and orientations including axis, right/left, upper/lower, above/under, etc. It should be understood, however, that any direction and orientation references are simply examples and that any particular direction or orientation may depend on the particular object, and/or the orientation of the particular object, with which the direction or orientation reference is made. Like numbers refer to like elements throughout.

An aspect of the invention provides an apparatus to control a flow of gas in a spiral course. In certain other embodiments of the invention, an apparatus may capture by-products produced in CVD process by diverting the gas in a spiral course.

FIG. 1 illustrates a schematic view of a CVD process system 100. In the CVD process, such as depositing a silicon nitride thin film on a semiconductor substrate (not shown) provided in a furnace 102, precursors (e.g., dichlorosilane ($SiH_2Cl$) and ammonia ($NH_3$)) may be supplied to the furnace. The vacuum pump 104 coupled to the furnace 102 may reduce the internal pressure of the furnace 102 to a predetermined vacuum pressure that is suitable for the thin film deposition. Then the precursors may be heated to a predetermined vaporizing temperature. The precursors may surround and react with the substrate and form a thin film on the substrate. By-products such as ammonium chloride ($NH_4Cl$) may be produced from the CVD process. As described above, by-products may leave the furnace 102 in vapor form and be discharged out of the furnace 102. Because ammonium chloride ($NH_4Cl$) easily condenses to fine powder in any cold surface of the CVD process system 100 such as valve, vacuum pump and vacuum pump exhaust line, a cold trap 106 may be introduced in the system 100.

A schematic view of the cold trap 106 in accordance with one embodiment of the present invention is illustrated by FIG. 2A. The cold trap 106 may comprise a housing 202. The housing 202 may comprise a first portion 204 and a second portion 206 each of them may be or may not be an integral part of the housing. In some examples, the first portion 204 and the second portion 206 may have similar shape (e.g., cylindrical shape as shown in FIG. 2A) or different shapes (e.g., a conical cylinder and trapezoidal cylinder). The first portion 204 and the second portion 206 may have similar size, for example, in a cup shape or different sizes, such as having different diameters as shown in FIG. 2A. A bottom plate 208, a lateral wall 210 and a cover plate 212 may form a closure space. The cover plate 212 with a post 214 substantially perpendicularly connected underneath the cover plate 212 is disposed on the top of housing 202. Part of the post 214 may be hollow configured for cooling fluid to flow through. The post 214 is within the housing 202 and may have a longitudinal axis A-A. In this embodiment, the longitudinal axis A-A of the post 214 may be coincident with that of the housing 202.

The cold trap 106 may also include a gas inlet port configured for gas to flow through into the housing 202 and a gas outlet port configured for gas to flow through out of the housing 202. Depending on various applications, there may be a variety of arrangements of the gas inlet port and the gas outlet port. For example, one of the gas inlet port and the gas outlet port may be arranged on cover plate 212 or upper portion of the lateral wall 210. The other one of the gas inlet port and the gas outlet port may be arranged on bottom plate 208 or lower portion of the lateral wall 210. In the embodiment illustrated in FIG. 2A, a gas inlet port 216 is arranged on lower portion of the lateral wall 210. A gas outlet port 218 is arranged on the cover plate 212. By-products gas discharged from the vacuum pump 104 (shown in FIG. 1) may flow into the cold trap housing 202 through the gas inlet port 216. The gas inlet port 216 may be oblique to the longitudinal axis A-A of the housing 202. Although there is only gas inlet port shown in this embodiment, there may be two or more gas inlet ports for the gas to flow through. Gas that is devoid of the by-products such as ammonium chloride ($NH_4Cl$) may flow out of the housing 202 through the gas outlet port 218.

To cool down the temperature of the gas that flows into the cold trap, thus capturing the by-products and retain the by-products in the cold trap, the cold trap 106 may also comprise a cooling member. The cooling member may comprise a cooling fluid inlet configured for cooling fluid to flow through into the housing 202 and a cooling fluid outlet configured for cooling fluid to flow through out of the housing 202. Depending on various applications, there may be a variety of arrangements of the cooling fluid inlet and the cooling fluid outlet. FIG. 2A illustrates that a cooling fluid inlet 220 and a cooling fluid outlet 222 may both be arranged on the cover plate 212. In some other embodiments, the cooling fluid inlet and outlet may be arranged on a lateral wall at same or different vertical positions. The cooling member may also comprise a plurality of parallel cooling plates, e.g., 224, 226, 228. Each of the cooling plates is connected to the post 214 and spaced apart in a direction along the longitudinal axis A-A. A surface of each cooling plate may be substantially perpendicular to the longitudinal axis of the post 214. Each cooling plate may have a cooling plate opening. For example, cooling plate openings 230, 232 and 234 may be formed on the cooling plates 224, 226 and 228 respectively. FIG. 2B illustrates a sectional view of the cooling plate opening 234 and the cooling plate 228. Referring back to FIG. 2A, a space for gas to flow may be defined by two adjacent plates and the lateral wall of the housing. For example, cover plate 212, cooling plate 224 and the lateral wall of the housing 202 may define a space 236. Adjacent cooling plates 224, 226 and the lateral wall may define a space 238. Similarly, adjacent cooling plates 226, 228 and the lateral wall may define a space 240. The cooling member may also comprise cooling pipes, such as cooling pipe 242, 244 and 246 configured for the cooling fluid to flow through within the housing. The post 214 may also be part of the cooling member to transport the cooling fluid. The cooling fluid may flow onto the cooling plates through cooling pipes or part of the post. For example, the cooling fluid may flow into the housing 202 from the cooling fluid inlet 220 and then flow onto the cooling plate 224 through cooling pipe 242.

The cooling fluid may then flow from the cooling plate 224 onto the cooling plate 226 through the post 214 and then from the cooling plate 226 onto the cooling plate 228 through the cooling pipe 244. The cooling fluid may then flow out of the housing 202 from the cooling fluid outlet 222 through the post 214 and cooling pipe 246. FIG. 2C illustrates an exemplary flow path that the cooling fluid flows through. Instead of the cooling pipes and the post, there may be other methods to transport the cooling fluid thereby cooling down the gas that flows in the housing. As illustrated in FIG. 2C, the cooling fluid may flow in a direction opposed to the direction in which the gas flows to efficiently cool down the gas.

To retain as many as by-products in the cold trap, a spiral path guiding member may be employed. The spiral path guiding member may comprise groups of guiding plates (e.g., 302, 304 and 306) as shown in FIG. 3. Each group may be connected to the post 214. Each guiding plate of each group, such as 302a, 302b and 302c of group 302, may be connected to the post 214 in an axial direction. The surface of each guiding plate may be substantially parallel to the longitudinal axis A-A of the post 214. At least some of the guiding plates of each group may have a guiding plate opening, e.g., 308, 310 and 312 to guide the gas flow. The guiding plates in one group may have different heights. At least one guiding plate may be shorter than other guiding plates to form a space above the at least one shorter guiding plate. For example, the guiding plate 302c may be shorter than the guiding plates 302a and 302b to form a space between the cover plate 212 and the guiding plate 302c. Guiding plate 304c may be shorter than guiding plates 304a and 304b to form a space between the cooling plate 224 and the guiding plate 304c. Guiding plate 306c may be shorter than guiding plates 306a and 306b to form a space between the cooling plate 226 and the guiding plate 306c. These spaces in combination with the guiding plate openings may facilitate gas to flow in a spiral flow path within the housing.

Referring back to FIG. 2A, the cold trap 106 may also comprise a gas flow guiding member 250. FIG. 4 illustrates a view of the gas flow guiding member 250 in accordance with an example embodiment of the invention. The gas flow guiding member 250 may comprise a tubular body 402 with an open top end 404 and a plurality of holes 406 formed on the side of the tubular body 402. The post 214 may extend into the tubular body 402 with a bottom cooling plate (e.g., the cooling plate 228) placed on the top open end 404 of the tubular body 402, as shown in FIG. 2A.

In operation, referring back to FIG. 2A, the gas may enter the cold trap 106 from the gas inlet port 216 and flows through at least one of the plurality of holes 406. When the gas flows through the holes 406, the by-products such as $NH_4Cl$ may condense on surface of the tubular body 402. The gas may then rise upward in a gas flow direction, such as direction B. Because each cooling plate has at least one cooling plate opening the gas may get into a space at a higher level through the cooling plate opening(s). For example, the gas may flow into the space 240 through the cooling plate opening 234 and then flow through the guiding plate opening(s) (e.g., 312 in FIG. 3) in the space 240. The gas then flow into the space 238 at a higher level through the cooling plate opening 232. The cooling plates 226 and 228 may be adjusted to make the gas flow in a relatively longer path in the space 240.

When the gas gets into the space 238, similarly, the gas may flow through the guiding plate opening(s) (e.g., 310) in the space 238 and then flow into the space 236 through the cooling plate opening 230. The gas may then flow out of the cold trap 106 from the gas outlet port 218. FIG. 5 illustrates a gas flow path within the housing 202 in accordance with an embodiment of the invention.

Referring back to FIG. 1, the cold trap 106 is at exit of the vacuum pump 104, followed by a scrubbing system 108. In this manner, gas inlet port 216 receives gas from the furnace. Gas is output from the gas outlet port 218. In another embodiment, the cold trap may be at exit of the furnace 102 and followed by the vacuum pump 104. In some embodiments, there may be more than one cold trap. For example, one cold trap may be installed between the furnace and the vacuum pump. Another cold trap may be installed between the vacuum pump and the scrubbing system.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Moreover, although the foregoing descriptions and the associated drawings describe exemplary embodiments in the context of certain exemplary combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

What is claimed is:

1. An apparatus for controlling a flow of gas, comprising: a spiral path guiding member comprising at least two groups of guiding plates, each guiding plate of each group disposed in an axial direction from a longitudinal axis, each group spaced apart in the longitudinal direction, a surface of each guiding plate being substantially parallel to the longitudinal axis, at least one guiding plate of each group having a guiding plate opening, wherein guiding plate openings of the guiding plates facilitate gas to flow in a spiral flow path.

2. The apparatus of claim 1 further comprising a gas flow guiding member, the gas flow guiding member comprising a tubular body with a plurality of holes formed on surface of the tubular body, wherein the tubular body encircles a portion of the longitudinal axis.

3. The apparatus of claim 2 further comprising a cooling member comprising a plurality of parallel cooling plates disposed in an axial direction from the longitudinal axis and spaced apart in a longitudinal direction, a surface of each cooling plate being substantially perpendicular to the longitudinal axis, each group of guiding plates being between two adjacent cooling plates, wherein the tubular body defines an open top end and a bottom cooling plate of the cooling member is disposed on the open top end of the tubular body.

4. The apparatus of claim 1 further comprising a cooling member comprising a plurality of parallel cooling plates disposed in an axial direction from the longitudinal axis and spaced apart in a longitudinal direction, a surface of each cooling plate being substantially perpendicular to the longitudinal axis, each cooling plate comprising at least one cooling plate opening, each group of guiding plates being in a space defined between two adjacent cooling plates.

5. The apparatus of claim 1 further comprising:
a housing comprising a bottom plate and a lateral wall; and
a cover plate disposed on top of the housing,
wherein the longitudinal axis is substantially perpendicular to the cover plate, and
wherein the spiral path guiding member is disposed within the housing.

6. The apparatus of claim 5 further comprising:
a gas inlet port configured for gas to flow through into the housing; and
a gas outlet port configured for gas to flow through out of the housing.

7. The apparatus of claim 5 further comprising:
a cooling fluid inlet configured for cooling fluid to flow through into the housing; and
a cooling fluid outlet configured for cooling fluid to flow through out of the housing.

8. The apparatus of claim 1, further comprising a post disposed along the longitudinal axis, wherein the post is configured for cooling fluid to flow through.

9. The apparatus of claim 1, wherein at least one guiding plate is shorter than other guiding plates in the group to form a space above the at least one guiding plate.

10. A method of controlling a flow of gas, comprising:
diverting a flow of gas in a spiral flow path defined by a spiral path guiding member comprising at least two groups of guiding plates, each guiding plate of each group disposed in an axial direction from a longitudinal axis, each group spaced apart in the longitudinal direction, a surface of each guiding plate being substantially parallel to the longitudinal axis, at least one guiding plate of each group having a guiding plate opening, wherein guiding plate openings of the guiding plates define a portion of the spiral flow path.

11. The method of claim 10 further comprising:
receiving gas from a gas inlet port configured for gas to flow through into a housing;
directing the gas to flow through one of a plurality of holes in the side of a tubular body of a gas flow guiding member to a cooling plate;
directing the gas to flow through a cooling plate opening formed on each cooling plate; and
discharging the gas out of the housing from a gas outlet port.

12. The method of claim 10 further comprising:
receiving cooling fluid from a cooling fluid inlet;
directing the cooling fluid onto the cooling plate; and
discharging the cooling fluid from a cooling fluid outlet.

13. The method of claim 10 further comprising directing the cooling fluid onto the cooling plates through one of a cooling pipe and a post, wherein the post is disposed along the longitudinal axis.

14. The method of claim 10, wherein the gas provided in the housing is received from a LPCVD process, and wherein the method is configured to collect by-products generated in the LPCVD process.

15. The method of claim 10 comprising providing the gas in the housing, the housing comprising a bottom plate and a lateral wall, a post substantially perpendicularly connected to a cover plate and disposed along the longitudinal axis, the cover plate being disposed on top of the housing with the post in the housing.

16. An apparatus for controlling a gas flow, the apparatus comprising:
a post having a longitudinal axis;
a cooling member comprising two or more parallel cooling plates connected to the post and spaced apart in a longitudinal direction, a surface of each cooling plate being substantially perpendicular to the longitudinal axis of the post, each cooling plate comprising at least one cooling plate opening, two adjacent cooling plates configured to define a space; and
a spiral path guiding member comprising at least two groups of guiding plates, each guiding plate of each group connected to the post in an axial direction, each group placed in the space defined by two adjacent cooling plates, a surface of each guiding plate being substantially parallel to the longitudinal axis of the post, at least one guiding plate of each group having a guiding plate opening, at least one guiding plate being shorter than other guiding plates in the group to form a space above the shorter guiding plate, wherein the guiding plate opening and the space above the shorter guiding plate facilitate gas to flow in a spiral flow path.

17. The apparatus of claim 16 further comprising a gas flow guiding member, the gas flow guiding member comprising a tubular body with a plurality of holes formed on surface of the tubular body, wherein the post is disposed in the tubular body.

18. The apparatus of claim 16 further comprising:
a gas inlet port configured for gas to flow through into the housing; and
a gas outlet port configured for gas to flow through out of the housing.

19. The apparatus of claim 18 further comprising:
a cooling fluid inlet configured for cooling fluid to flow through into the housing; and
a cooling fluid outlet configured for cooling fluid to flow through out of the housing.

20. The apparatus of claim 19, wherein the cooling fluid flows in a direction opposed to the direction in which the gas flows.

* * * * *